United States Patent
Kamibayashi

(10) Patent No.: US 8,526,638 B2
(45) Date of Patent: Sep. 3, 2013

(54) GAIN CONTROL CIRCUIT AND ELECTRONIC VOLUME CIRCUIT

(75) Inventor: Toshiya Kamibayashi, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 893 days.

(21) Appl. No.: 12/693,207

(22) Filed: Jan. 25, 2010

(65) Prior Publication Data

US 2010/0244952 A1 Sep. 30, 2010

(30) Foreign Application Priority Data

Mar. 24, 2009 (JP) .................... 2009-71886

(51) Int. Cl.
  *H03G 3/00* (2006.01)
  *H03G 9/00* (2006.01)
(52) U.S. Cl.
  USPC .......... 381/107; 381/102; 381/104; 381/120; 330/278; 330/284
(58) Field of Classification Search
  USPC ................ 381/102, 104, 106, 107, 108, 109, 381/120, 123, 111–117, 321; 700/94; 330/10, 330/251, 207 A, 278–285
  See application file for complete search history.

(56) References Cited

U.S. PATENT DOCUMENTS

| | | | | |
|---|---|---|---|---|
| 5,172,358 A * | 12/1992 | Kimura | ...................... | 369/47.26 |
| 5,566,363 A * | 10/1996 | Senda | ............................ | 455/126 |
| 5,974,156 A * | 10/1999 | Sauvagerd | ....................... | 381/98 |
| 7,336,130 B2 * | 2/2008 | Takahata | ....................... | 330/284 |
| 7,443,242 B2 * | 10/2008 | Ishida | ........................... | 330/279 |
| 7,583,809 B2 * | 9/2009 | Okimoto et al. | ............. | 381/104 |
| 7,734,267 B2 * | 6/2010 | Wagner | ...................... | 455/240.1 |
| 7,982,541 B2 * | 7/2011 | Nakai et al. | .................... | 330/279 |
| 8,184,206 B2 * | 5/2012 | Magnusen | ...................... | 348/678 |
| 8,324,969 B2 * | 12/2012 | Loeda et al. | .................. | 330/282 |
| 2005/0030099 A1* | 2/2005 | Ishida et al. | .................. | 330/279 |
| 2005/0123152 A1* | 6/2005 | Magrath | ....................... | 381/104 |
| 2012/0076246 A1* | 3/2012 | Okada et al. | .................. | 375/340 |

FOREIGN PATENT DOCUMENTS

| | | |
|---|---|---|
| JP | 11-177371 A | 7/1999 |
| JP | 2002-026678 A | 1/2002 |
| JP | 2002-252536 A | 9/2002 |

* cited by examiner

*Primary Examiner* — Xu Mei
(74) *Attorney, Agent, or Firm* — Arent Fox LLP

(57) ABSTRACT

A gain control circuit includes a comparator that compares an input gain value with a count value to generate a comparison result signal, a counter that counts up or counts down the count value in accordance with the comparison result signal, and a gain modulator circuit that modulates the count value to generate a gain control signal which changes in a time-divided manner. The gain modulator circuit modulates the count value so that a gain obtained by time-averaging a gain corresponding to the gain control signal matches a gain based on the count value.

11 Claims, 12 Drawing Sheets

| TIME | DI | N1 (DI-N3) | N2 (N1 Z⁻¹) | N3 (DO-N2) | DO (TRUNCATION) |
|---|---|---|---|---|---|
| INITIAL VALUE | 0 | 0 | 0 | 0 | 0 |
| 0 | 1.25 | 1.25 | 0 | 0 | 0 |
| 1 | 1.25 | 1.50 | 1.25 | −0.25 | 1 |
| 2 | 1.25 | 1.75 | 1.50 | −0.50 | 1 |
| 3 | 1.25 | 2.00 | 1.75 | −0.75 | 1 |
| 4 | 1.25 | 1.25 | 2.00 | 0 | 2 |
| 5 | 1.25 | 1.50 | 1.25 | −0.25 | 1 |
| 6 | 1.25 | 1.75 | 1.50 | −0.50 | 1 |
| 7 | 1.25 | 2.00 | 1.75 | −0.75 | 1 |
| 8 | 1.25 | 1.25 | 2.00 | 0 | 2 |
| 9 | 1.25 | 1.50 | 1.25 | −0.25 | 1 |
| 10 | 1.25 | 1.75 | 1.50 | −0.50 | 1 |
| 11 | 1.25 | 2.00 | 1.75 | −0.75 | 1 |
| 12 | 1.25 | 1.25 | 2.00 | 0 | 2 |
| 13 | 1.25 | 1.50 | 1.25 | −0.25 | 1 |
| 14 | 1.25 | 1.75 | 1.50 | −0.50 | 1 |
| 15 | 1.25 | 2.00 | 1.75 | −0.75 | 1 |

| TIME | DI | N1<br>(DI-N3) | N2<br>(N1 Z⁻¹) | N3<br>(DO-N2) | DO<br>(QUANTIZATION) |
|---|---|---|---|---|---|
| INITIAL VALUE | 0 | 0 | 0 | 0 | 0 |
| 0 | 1.25 | 1.25 | 0 | 0 | 0 |
| 1 | 1.25 | 1.50 | 1.25 | −0.25 | 1 |
| 2 | 1.25 | 0.75 | 1.50 | 0.50 | 2 |
| 3 | 1.25 | 1.00 | 0.75 | 0.25 | 1 |
| 4 | 1.25 | 1.25 | 1.00 | 0 | 1 |
| 5 | 1.25 | 1.50 | 1.25 | −0.25 | 1 |
| 6 | 1.25 | 0.75 | 1.50 | 0.50 | 2 |
| 7 | 1.25 | 1.00 | 0.75 | 0.25 | 1 |
| 8 | 1.25 | 1.25 | 1.00 | 0 | 1 |
| 9 | 1.25 | 1.50 | 1.25 | −0.25 | 1 |
| 10 | 1.25 | 0.75 | 1.50 | 0.50 | 2 |
| 11 | 1.25 | 1.00 | 0.75 | 0.25 | 1 |
| 12 | 1.25 | 1.25 | 1.00 | 0 | 1 |
| 13 | 1.25 | 1.50 | 1.25 | −0.25 | 1 |
| 14 | 1.25 | 0.75 | 1.50 | 0.50 | 2 |
| 15 | 1.25 | 1.00 | 0.75 | 0.25 | 1 |

COUNTH

FIG. 12B GAINmin
HIGH-ORDER BIT: g7
COUNTH (g0 – g7)
LOW-ORDER BIT: g6
COUNTL (f0 – f3) g5
g4
g3
g2
g1
g0

GAINmax

OUTPUT VOL OF g7
ΔΣ MODULATION g6
g5
g4
g3
g2
g1
g0

TIME AVERAGE

PROBABILITY DENSITY
LOW ⟵⟶ HIGH

US 8,526,638 B2

GAIN CONTROL CIRCUIT AND ELECTRONIC VOLUME CIRCUIT

CROSS-REFERENCE TO RELATED APPLICATIONS

This application claims the benefit of priority from Japanese Patent Application No. 2009-71886 filed on Mar. 24, 2009, the entire contents of which are incorporated herein by reference.

BACKGROUND

1. Field

The embodiments variations discussed herein relate to a gain control circuit and an electronic volume circuit having the gain control circuit.

2. Description of Related Art

Audio electronic circuits may include electronic volume circuits for adjusting the amplitudes (gains) of input signals. An electronic volume circuit includes, for example, resistors to which an input signal is applied, a resistor ladder circuit having switches that selectively couple connection nodes of the resistors to corresponding output nodes, and an operation amplifier that receives an input from the output node and outputs substantially the same potential as that of the output node to an output terminal. The resistors include, for example, multiple resistance elements coupled in series between a node to which an input signal is supplied and ground. Related technologies are disclosed in, for example, Japanese Laid-open Patent Publication Nos. H11-177371, 2002-26678, and 2002-252536.

SUMMARY

According to one aspect of the embodiments, a gain control circuit is provided which includes: a comparator that compares an input gain value with a count value to generate a comparison result signal; a counter that counts up or counts down the count value in accordance with the comparison result signal; and a gain modulator circuit that modulates the count value to generate a gain control signal which changes in a time-divided manner. The gain modulator circuit modulates the count value so that a gain obtained by time-averaging a gain corresponding to the gain control signal matches a gain based on the count value.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIGS. 12A to 12D illustrate exemplary operations of a delta-sigma modulator.

DESCRIPTION OF EMBODIMENTS

Switches in a resistor ladder circuit are controlled based on switch control signals generated by a gain control circuit. One of the switches switches to a conductive state and other switches switch to non-conductive states, so one of nodes of resistors is selected. In the resistor ladder circuit, the input signal is divided by resistance elements coupled in series and one of the nodes is selected by the corresponding switch.

The gain control circuit generates switch control signals in response to an input gain signal. When the gain of the input gain signals increases or decreases, the gain control circuit sequentially changes the switch control signals to change the present gain to an intended gain. During the change in the gain, the gain increases or decreases in minimum units of gain steps from the present gain to the intended gain. When the amount of change in the gain per step is reduced, a clicky sound (a clicking sound) involved in the gain change in one step is reduced.

Figure 1:
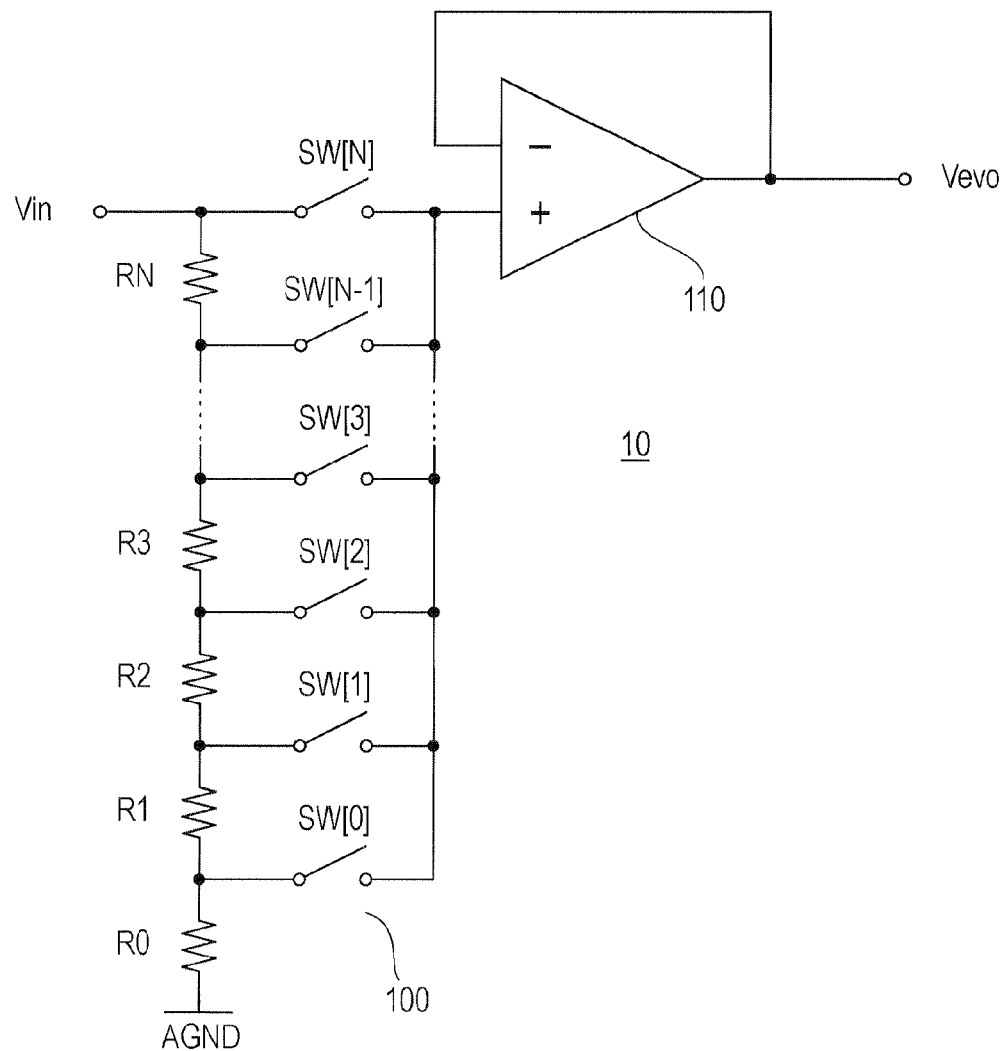
FIG. 1 illustrates an exemplary amplifier circuit.

FIG. 1 illustrates an exemplary amplifier circuit. An amplifier circuit 10 illustrated in FIG. 1 may be included in an electronic volume circuit. For example, the amplifier circuit 10 for the electronic volume circuit may be an analog circuit. An input signal Vin is input to the amplifier circuit 10. The amplifier circuit 10 includes a resistor ladder 100. The resistor ladder 100 includes resistors R0 to RN between an input terminal Vin and ground AGND and switches SW[0] to SW[N−1] for selecting nodes of the resistors R0 to RN. The amplifier circuit 10 includes an operation amplifier 110. The operation amplifier 110 has a positive input terminal coupled to nodes which are located opposite of the switches SW[0] to SW[N−1] and an output terminal coupled to a negative input terminal thereof. For example, one of the switches SW[0] to SW [N−1] is turned on and the other switches are turned off. The switches are controlled in accordance with switch control signals generated based on a gain control signal generated by a gain control circuit (not illustrated). The potential of the node selected by the switch SW is input to the positive input terminal of the operation amplifier 110 and a signal Vevo output from the output terminal thereof becomes substantially equal to the potential of the positive input terminal. Thus, for example, when the switch SW[0] is turned on, the gain becomes a minimum, and when the switch SW[N−1] is turned on, the gain becomes a maximum.

The amplifier circuit 10 amplifies or attenuates the input signal Vin at a gain, controlled by the gain control signal, to generate the output signal Vevo. The amplifier circuit 10 may have another circuit instead of the resistor ladder illustrated in FIG. 1. For example, in the amplifier circuit 10, drains of common-source transistors provided in parallel may be coupled to load resistors, an input signal Vin may be input to gates of the transistors, and at least one of the transistors may be activated based on a gain control signal. When the number of transistors to be activated increases, the gain may increase as a result of an increase in the drain current.

The amplifier circuit 10 has a gain resolution corresponding to the number of resistors R0 to RN. Thus, as the number of resistors R0 to RN increases, the number of controllable gains increases, the resolution of the gains increases, and the gain step becomes small. The higher the resistance accuracy of the resistors is, the higher the accuracies of the gains controlled become. The smaller the gain step is, the smaller, or the more faint, the clicking sound when the gain is variably controlled becomes. When the amplifier circuit 10 has a common-source-transistor amplifier circuit, the number of transistors may increase.

Figure 2:
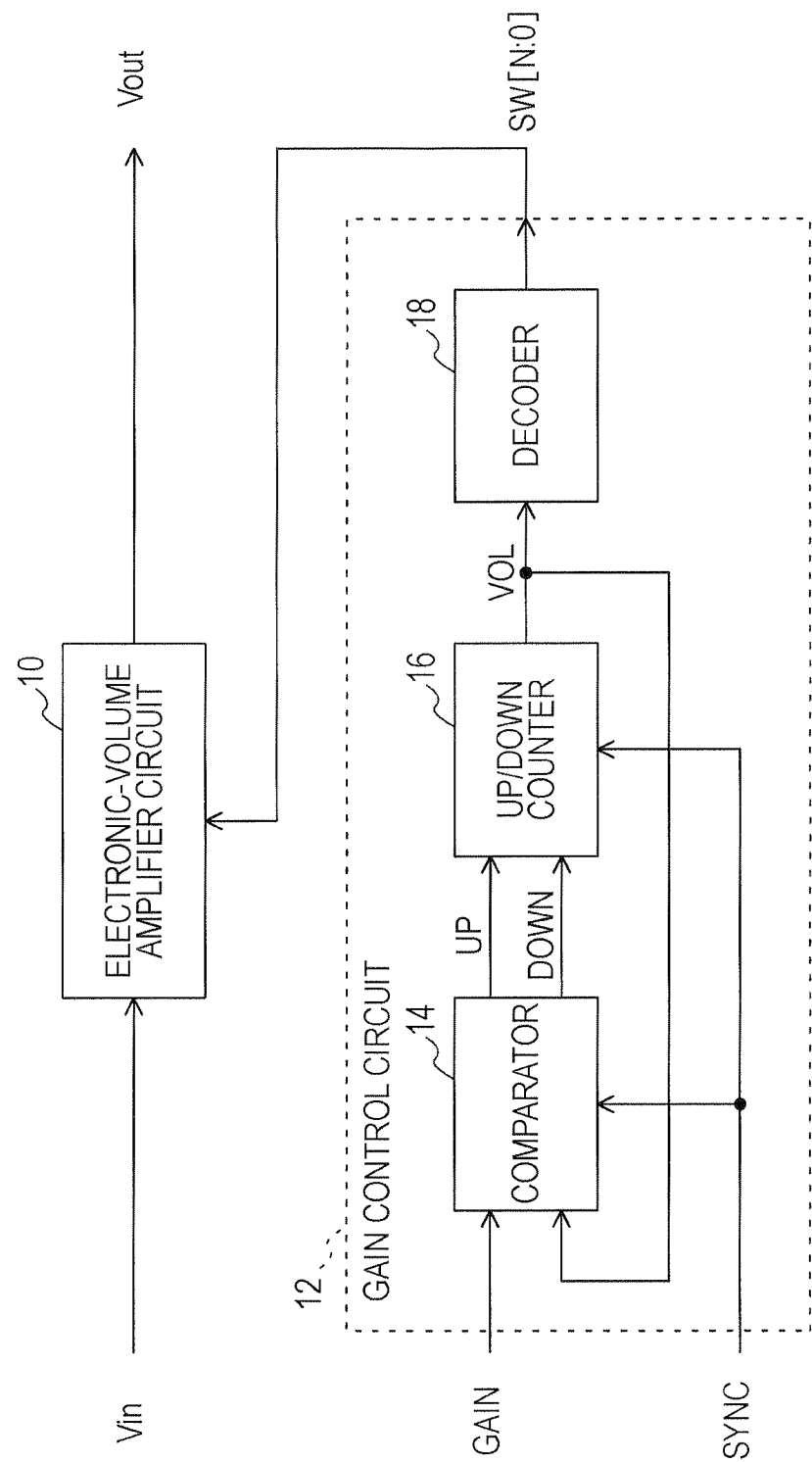
FIG. 2 illustrates an exemplary electronic volume circuit.

FIG. 2 illustrates an exemplary electronic volume circuit. The electronic volume circuit includes an electronic-volume amplifier circuit 10 and a gain control circuit 12. The gain control circuit 12 outputs switch control signals SW[N:0], which serve as the gain control signal, to the amplifier circuit 10. The gain control circuit 12 includes a comparator 14, an up/down counter 16, and a decoder 18. The comparator 14 compares an input gain GAIN with an output of the up/down counter 16, for example, the count value VOL. In accordance with a result of the comparison, the comparator 14 sets one of an up signal UP and a down signal DOWN to a high level. The up/down counter 16 counts up or counts down its count value in accordance with the up signal UP or the down signal DOWN. The decoder 18 decodes a count value VOL and outputs the switch control signals SW[N:0]. The count value VOL or the switch control signals SW[N:0] may correspond to the gain control signal for controlling the gain of the amplifier circuit 10.

A synchronization signal SYNC is supplied to the comparator 14 and the up/down counter 16. In synchronization with the synchronization signal SYNC, the comparator 14 performs comparison and the up/down counter 16 performs count-up or count-down (e.g., an increase or a decrease in the count).

Figure 3:
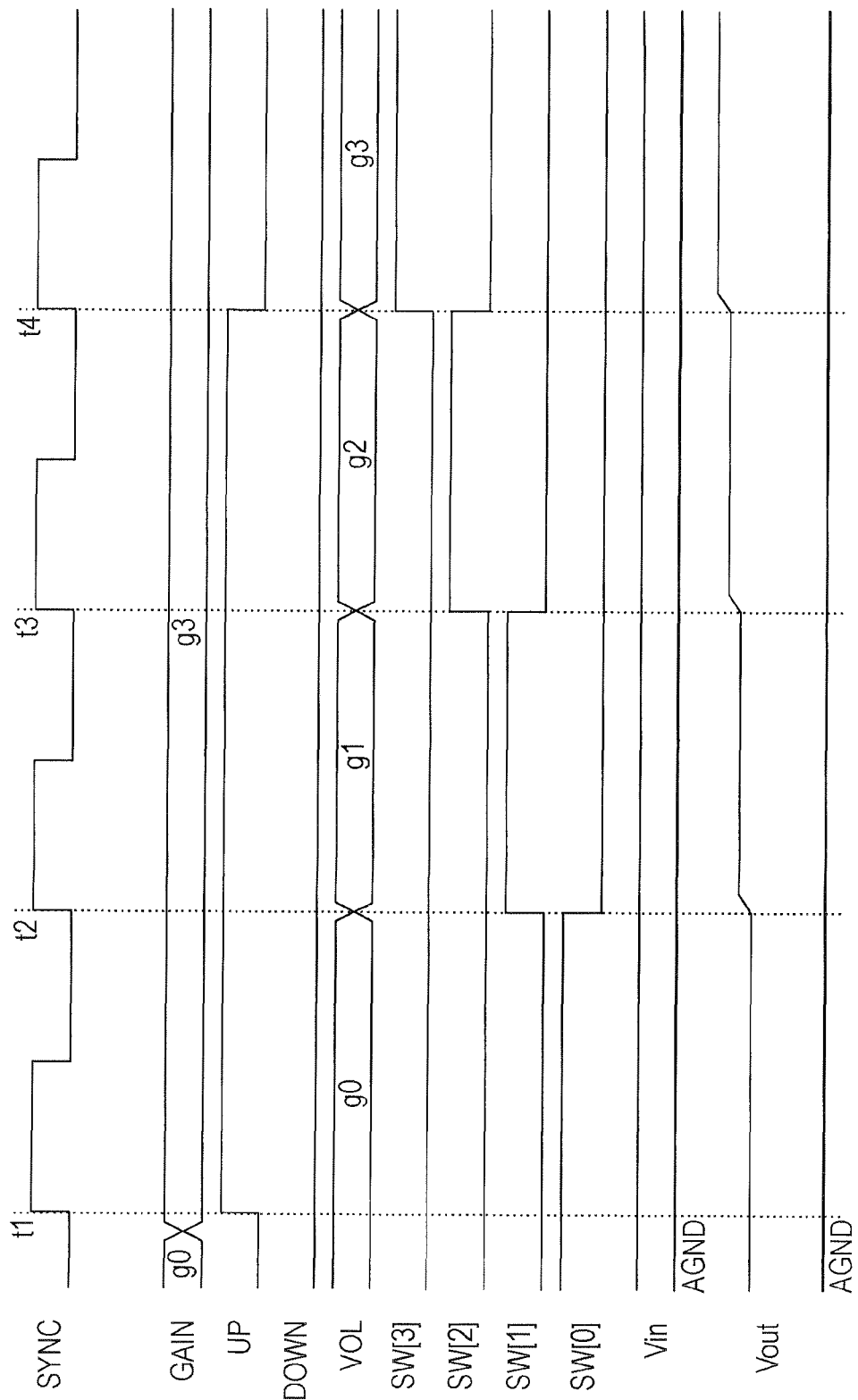
FIG. 3 illustrates an exemplary electronic volume circuit.

FIG. 3 illustrates exemplary operational waveforms of an electronic volume circuit. The electronic volume circuit illustrated in FIG. 3 may be the electronic volume circuit illustrated in FIG. 2. At time t1, the input gain GAIN changes from g0 to g3. At time t4 after three cycles of the synchronization signal SYNC, the output signal Vout of the intended gain g3 is output. In FIG. 3, a direct-current voltage is used as the input signal Vin.

Before time t1, the input gain GAIN is gain g0 and the count value VOL corresponding to the gain g0 is output from the up/down counter 16. Since the count value VOL and the input gain GAIN match each other, the comparator 14 sets the up signal UP and the down signal DOWN to low levels. For example, the count value VOL is g0 and the switch control signals SW[3] to SW[0], which correspond to decoded values of the count value VOL, have "0001. The switch SW0 in the amplifier circuit 10 is turned on, so that the gain is controlled to the minimum gain. FIG. 3 illustrates the switch control signals SW[3] to SW[0], which are lower-order four-bits of the switch control signals SW[N:0].

At time t1, the comparator 14 detects that the input gain GAIN changes from g0 to g3 and sets the up signal UP to the high level. At time t2, in response to the up signal UP at the high level, the up/down counter 16 counts up the count value VOL to g1. In response to the count value VOL indicating g1, the decoder 18 outputs "0010" as the switch control signals SW[3] to SW[0]. At time t3, in response to the up signal UP at the high level, the up/down counter 16 counts up the count value VOL to g2. In response to the count value VOL indicating g2, the decoder 18 changes the switch control signals SW[3] to SW[0] to "0100". At time t4, in response to the up signal UP at the high level, the up/down counter 16 counts up the count value VOL to g3. In response to the count value VOL indicating g3, the decoder 18 changes the switch control signals SW[3] to SW[0] to "1000". The switch SW3 is turned on and the gain is controlled to the gain g3.

When the input gain GAIN is changed, the gain control circuit 12 performs gain sweep control for incrementing or decrementing the gain by one step toward the changed gain. Through the gain sweep control, the increase or decrease in the steps of the gain of the output signal Vout is minimized, so that the clicking sound is reduced.

In the electronic volume circuit illustrated in FIG. 2, the gain control circuit 12 performs sweep control on the gains g0, g1, g2, or g3 to be output by the amplifier circuit 10. Thus, the size of the gain steps during the gain sweep is limited by the number of resistance elements in the amplifier circuit 10. Accordingly, when the circuit scale is reduced, the clicking sound may not be reduced. Changing the gain control signal in a time-divided manner may reduce the number of steps for changing the gain.

Figure 4:
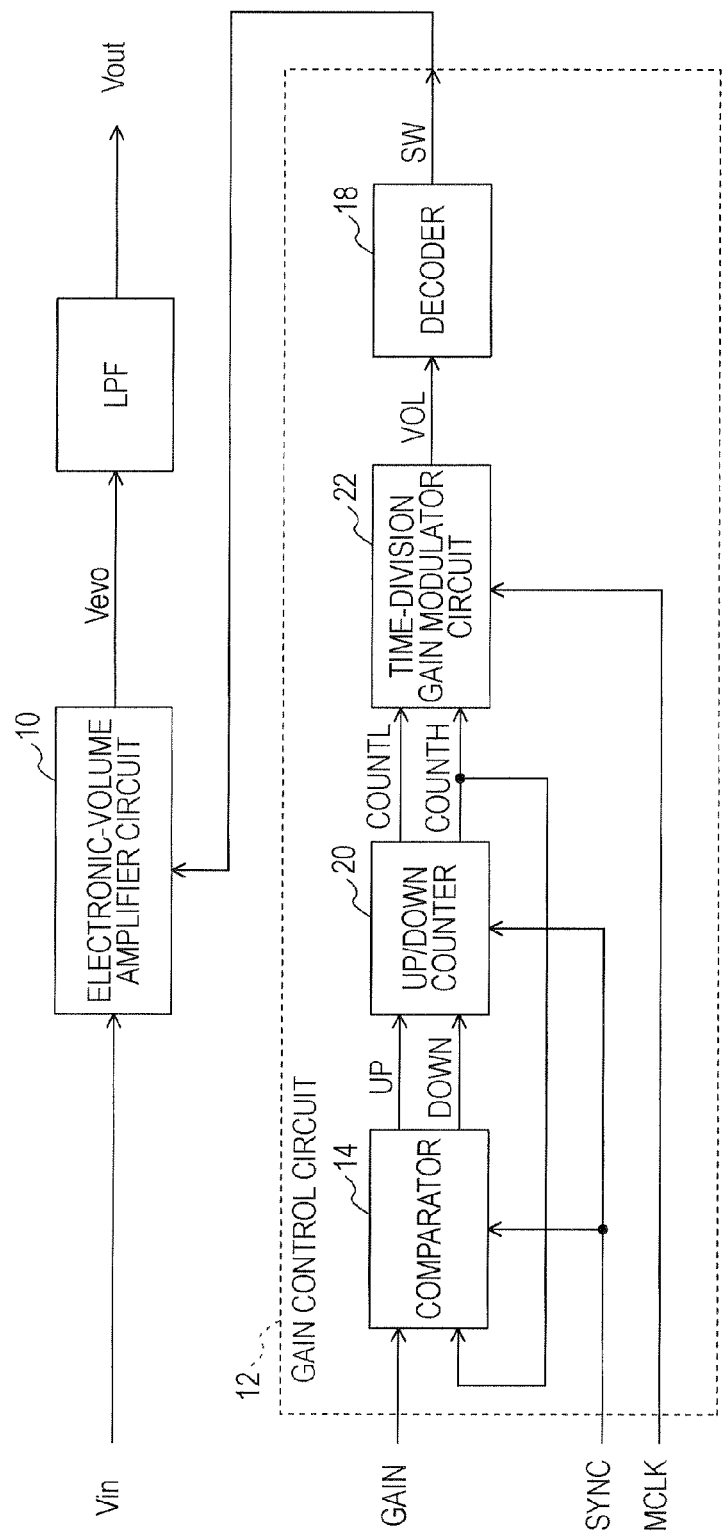
FIG. 4 illustrates an exemplary electronic volume circuit.

FIG. 4 illustrates an exemplary electronic volume circuit. The electronic volume circuit illustrated in FIG. 4 includes an amplifier circuit 10, a gain control circuit 12, and a low-pass filter LPF. In the gain control circuit 12, a time-division gain modulator circuit 22 is provided between an up/down counter 20 and a decoder 18. The low-pass filter LPF smoothes an output Vevo of the amplifier circuit 10. Since the time-division gain modulator circuit 22 is provided, the up/down counter 20 outputs a high-order count value COUNTH corresponding to, for example, the gain control signal VOL illustrated in FIG. 2, and a low-order count value COUNTL. A synchronization signal SYNC may be a clock obtained by dividing a master clock MCLK. The master clock MCLK has a frequency that is higher than the synchronization signal SYNC. The master clock MCLK is supplied to the time-division gain modulator circuit 22, and the time-division gain modulator circuit 22 performs modulation control in synchronization with the master clock MCLK. The synchronization signal SYNC has a frequency that is higher than the synchronization signal SYNC, illustrated in FIG. 2, so as to correspond to the low-order count value COUNTL generated by the counter 20. Other configurations may be substantially the same as or similar to those illustrated in FIG. 2.

The up/down counter 20 counts up or counts down the high-accuracy count value COUNTH or COUNTL in accordance with the up signal UP or the down signal DOWN output from the comparator 14. The number of bits of the high-order count value COUNTH may be the same as, for example, the number of bits of the gain control signal VOL and corresponds to the number of gain steps that are controlled by the amplifier circuit 10. The high-order count value COUNTH may correspond to a gain control signal for rough adjustment. The low-order count value COUNTL may correspond to a gain control signal for fine adjustment.

The time-division gain modulator circuit 22 modulates the count values COUNTH and COUNTL to generate the gain control signal VOL that changes in a time-divided manner. The time-division gain modulator circuit 22 performs a quantization operation to set the gain control signal VOL to one of the high-order count value COUNTH and a count value that is adjacent thereto. In order to generate the time-divided gain control signal VOL, the time-division gain modulator circuit 22 modulates the count values COUNTH and COUNTL so that a time-averaged value of the gain control signal VOL, which changes in a time-divided manner, matches the count values COUNTH and COUNTL. A system for the modulation may correspond to pulse-width modulation (PWM) or pulse density modulation (PDM). The time-division gain modulator circuit 22 changes the gain control signal VOL to one of adjacent high-order count values in a time-divided manner and performs control so that the time-averaged value of the gain control signals VOL reaches substantially the medium gain of gains of the resistor ladder circuit in the amplifier circuit 10.

The decoder 18 generates the switch control signals SW[N:0] corresponding to the gain control signals VOL on a one-to-one basis. In accordance with the time-division modulation of the gain control signal VOL, the switch control signals are also changed in a time-divided manner and the output Vevo of the amplifier circuit 10 also changes in a time-divided manner. The smoothing circuit LPF smoothes high-frequency components of the output Vevo to generate an output signal Vout.

Figure 5:
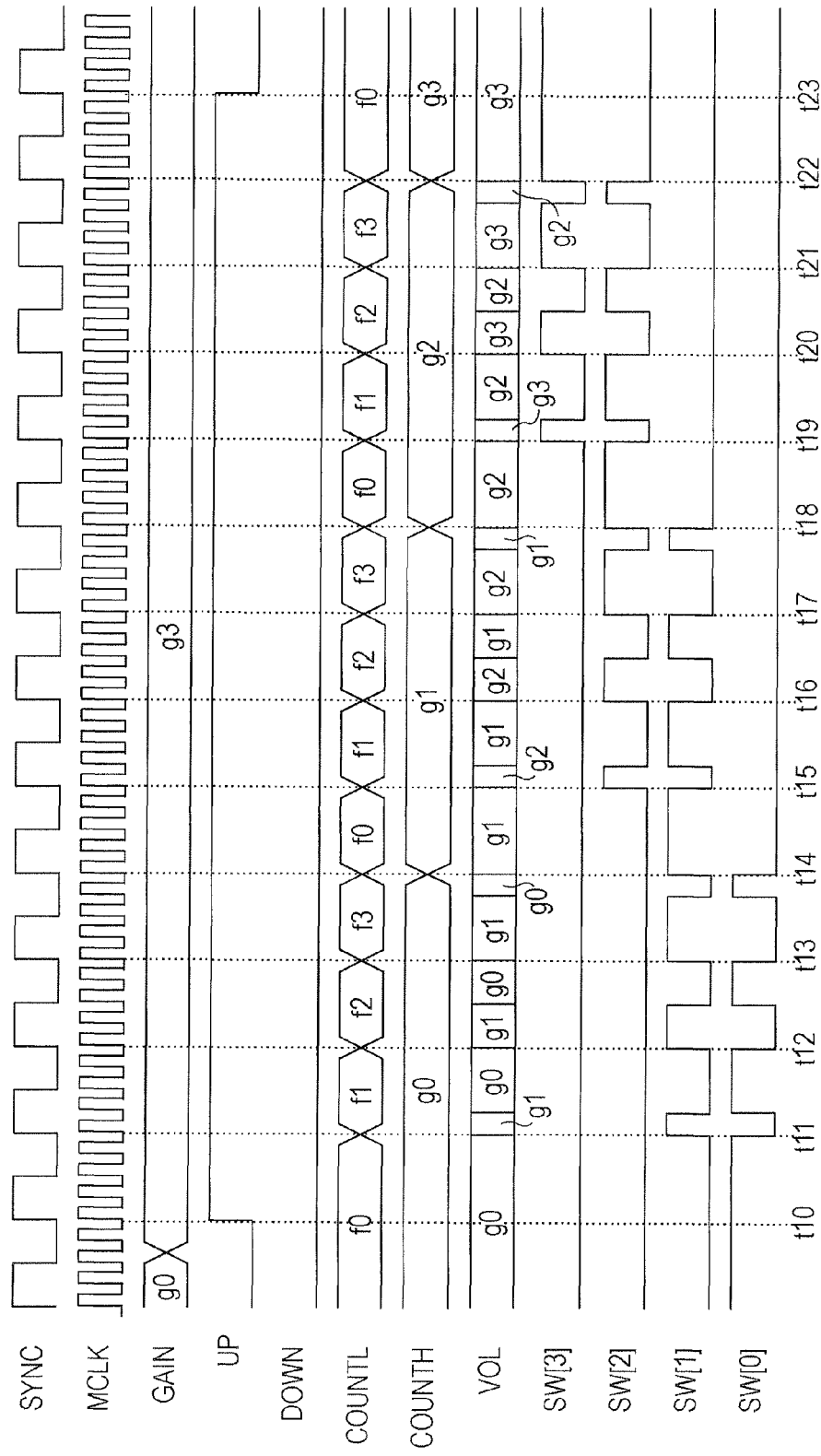
FIG. 5 illustrates exemplary operational waveforms of an electronic volume circuit.
Figure 6:
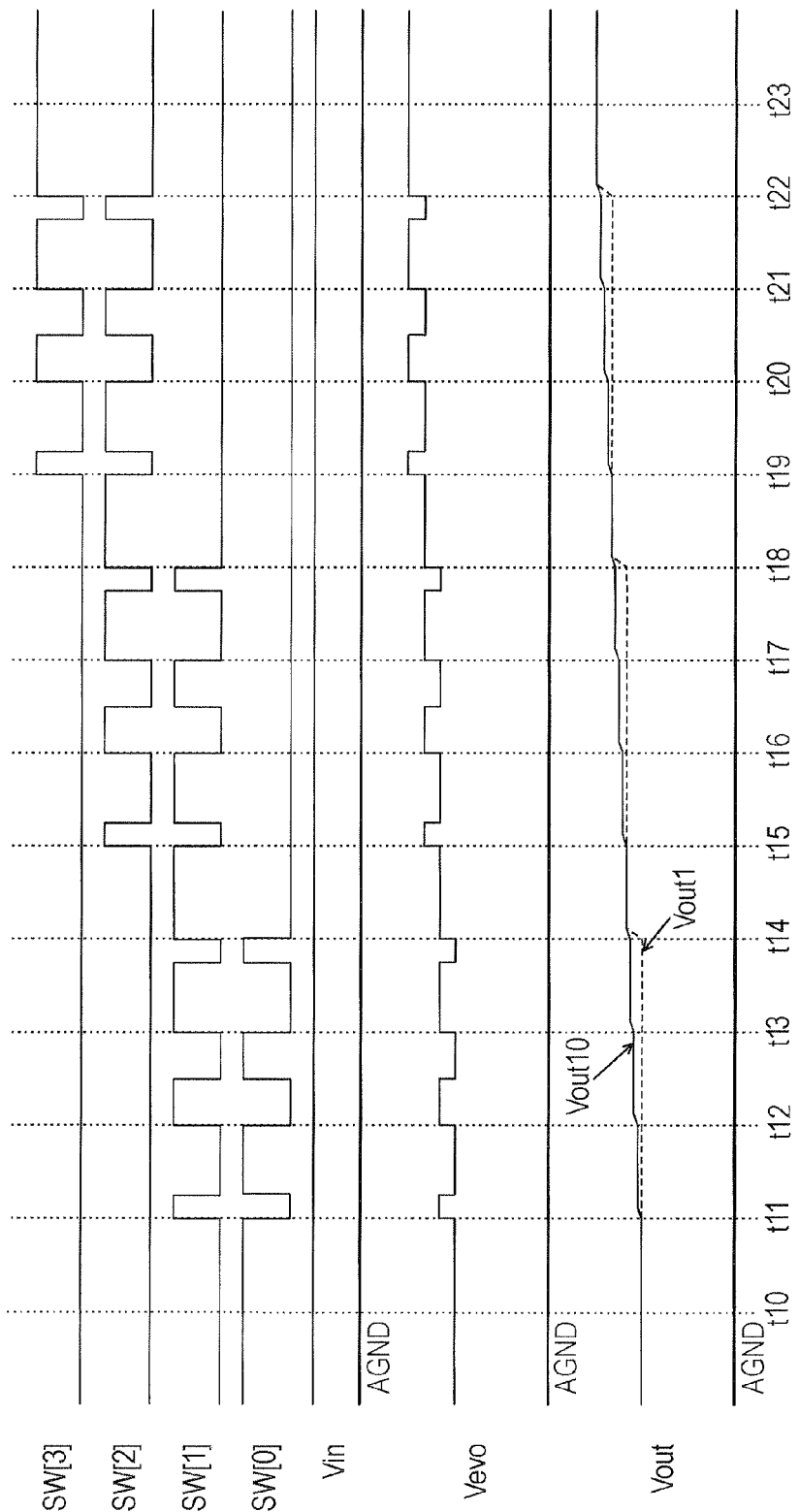
FIG. 6 illustrates exemplary operational waveforms of an electronic volume circuit.

FIGS. 5 and 6 illustrate exemplary operational waveforms of an electronic volume circuit. The electronic volume circuit illustrated in FIGS. 5 and 6 may be the electronic volume circuit illustrated in FIG. 4. The operational waveforms illustrated in FIGS. 5 and 6 may be operation waveforms obtained when the gain of the electronic volume circuit increases. The synchronization signal SYNC illustrated in FIGS. 5 and 6 has four times the frequency of the synchronization signal illustrated in FIG. 2. The low-order count value COUNTL assumes one of four values f0 to f3, and increases by four steps from f0 to f3 while the high-order count value COUNTH increases from g0 to g1 by one step. The synchronization signal SYNC may be four times the frequency due to the four steps of the low-order count value COUNTL. The master clock MCLK may have four times the cycle of the synchronization clock SYNC. The synchronization signal SYNC may be a clock obtained by dividing the master clock MCLK by four. The number of steps of the low-order count value COUNTL and the division ratio of the synchronization clock SYNC may have any values.

In FIGS. 5 and 6, the time period from t10 to t23, which may be synchronized with the rising edges of the synchronization clock SYNC, is illustrated. FIGS. 5 and 6 also illustrate a gain sweep operation when the input gain GAIN is switched from g0 to g3, as in FIG. 3.

Before time t10, the input gain GAIN is a gain g0, the high-order count value COUNTH of the up/down counter 20 indicates go, and the low-order count value COUNTL indicates a gain f0. The input gain GAIN=g0 and the high-order count value COUNTH=g0 are substantially equal to each other, and the up signal UP and the down signal DOWN of the comparator 14 are at a low level.

At time t10, the comparator 14 detects that g3 indicated by the input gain GAIN is higher than the count value g0 and sets the up signal UP to a high level. At time t11, the up/down counter 20 starts count-up in response to the up signal UP having the high level. At time t11, the low-order count value COUNTL increase to a gain f1.

During one cycle of the synchronization signal SYNC from time t11 to time t12, the time-division gain modulator circuit 22 modulates the count values COUNTH and COUNTL in synchronization with the master clock MCLK, and changes, in a time-divided manner, the gain control signal VOL to one of adjacent gains g0 and g1 corresponding to the high-order count value COUNTH=g0 and a high-order count value COUNTH=g1 respectively. In a period of time t11 to t12, the time-division gain modulator circuit 22 sets the gain control signal VOL to the gain g1 in one cycle of the master clock MCLK and to the gain g0 in the remaining three cycles. Correspondingly, the decoder 18 sets the switch control signals SW[3] to SW[0] to "0010" and "0001" in a 1:3 time division. Thus, the gain control signal VOL is set to the gain g1 or g0 at a rate of 1:3 of four cycles of the master clock MCLK from time t11 to time t12. A time average of the gain control signals VOL in the four cycles of the master clock MCLK from time t11 to time t12 is given by (3/4)g0+(1/4)g1=(5/4)g0.

Referring to FIG. 6, the output Vevo of the amplifier circuit 10 is set to a level corresponding to the gain g1 or g0 between one cycle and three cycles of the master clock MCLK so as to correspond to the change between "0010" and "0001" of the switch control signals SW[3] to SW[0]. The output Vevo of the amplifier circuit 10 is smoothed by the smoothing circuit LPF, and in the period of time t11 to time t12, the potential of the output signal Vout becomes one-fourth the potential between the gain g0 and the gain g1.

The period in which the low-order count value COUNTL is f1 may be provided in multiple cycles of the synchronization signal SYNC. In the case of multiple cycles, the amount of time of the smoothing processing performed by the smoothing circuit LPF is increased and the degree of the smoothing is increased. In the period of time t11 to time t12, the gain control signal VOL may be set to g0 in the first three cycles and be set to g1 in the remaining one cycle. The gain control signal VOL may be set to g0 in the first one cycle and the last two cycles and be set to g1 in the one cycle therebetween. The master clock MCLK may be set to twice the frequency, for example, to eight times the frequency of the synchronization signal SYNC. In such a case, the gain control signal VOL may be set to g0 in the first three cycles, be set to g1 in the next two cycles, and be set to g0 in the last three cycles.

At time t12, the up/down counter 20 sets the low-order count value COUNTL to f2. The time-division gain modulator circuit 22 performs time-division modulation on the high-order count value COUNTH indicating g0 and the low-order count value COUNTL indicating f2. By doing so, in the period of time t12 to t13, the time-division gain modulator circuit 22 generates a gain control signal VOL indicating g1 in the first two cycles of the master clock MCLK and generates a gain control signal VOL indicating g0 in the last two cycles. The switch control signals SW[3] to SW[0] are set to "0010" in the first half period and are set to "0001" in the last half period. The output Vevo of the amplifier circuit 10 is set to have a potential corresponding to the gain g1 in the first half period and is set to have a potential corresponding to the gain g0 in the last half period. The smoothed output signal Vout is set to have a potential "(g1−g0)/2", which is obtained by time-averaging the gains g0 and g1.

At time t13, the up/down counter 20 sets the low-order count value COUNTL to f3. The time-division gain modulator circuit 22 performs time-division modulation on the low-order count value COUNTH indicating g0 and the low-order count value COUNTL indicating f3. By doing so, in the period of time t13 to time t14, the time-division gain modulator circuit 22 generates a gain control signal VOL indicating g1 in the first three cycles of the master clock MCLK and generates a gain control signal VOL indicating g0 in the last one cycle. The switch control signals SW[3] to SW[0] are set to "0010" in the first three cycles and are set to "0001" in the last one cycle. The output Vevo of the amplifier circuit 10 is first amplified to have a potential corresponding to the gain g1 and is lastly amplified to have a potential corresponding to the gain g0. The smoothed output signal Vout is set to have a potential "(3g1−g0)/4", which is obtained by time-averaging the gains g0 and g1.

At time t14, the up/down counter 20 sets the high-order count value COUNTH to g1 and sets the low-order count value COUNTL to f0. In the period of time t14 to time t15, the gain-control signal VOL of the time-division gain modulator circuit 22 remains to be g1, which is substantially equal to the high-order count value COUNTH.

At times t15, t16, t17, and t18, the above-described time-division-modulated gain control signals VOL and corresponding switch control signals SW[3] to SW[0] are generated. The time average of the gain control signal VOL in each cycle is controlled to have a value corresponding to the high-accuracy count values COUNTH and COUNTL of the up/down counter 20. At time t19 to time t22, the time-division modulation may be similarly performed. At time t22, the high-order count value COUNTH may be set to g3. At time t23, the comparator 14 returns the up signal UP to a low level, and the gain sweep control from the gain g0 to the gain g3 may be completed.

The output signal Vout illustrated in FIG. 6 may correspond to a signal Vout1 in FIG. 3. At times t14, t18, and t22, the potential of the output signal Vout1 increases in increments of one step. In the period of time t12 to time t22, the potential of an output signal Vout10 increases in increments of one-fourth of the step between the gain g0 and the gain g1. Since the gain control circuit 12 sets the gain control signal VOL to a time-division-modulated signal, the step width of the output signal Vout10 is set small while the gain step of the amplifier circuit 10 is kept large. As a result, the clicking sound during change of the gain may be reduced.

The output signal Vout10 may not be generated by the resistance elements of the resistor ladder 100 in the amplifier circuit 10 being segmented for a higher resolution. The output signal Vout1 is controlled by the time-division modulation gain control circuit 12 to have a fine-adjustment level of the low-order count value COUNTL between rough-adjustment levels of the high-order count values COUNTH.

Figure 7:
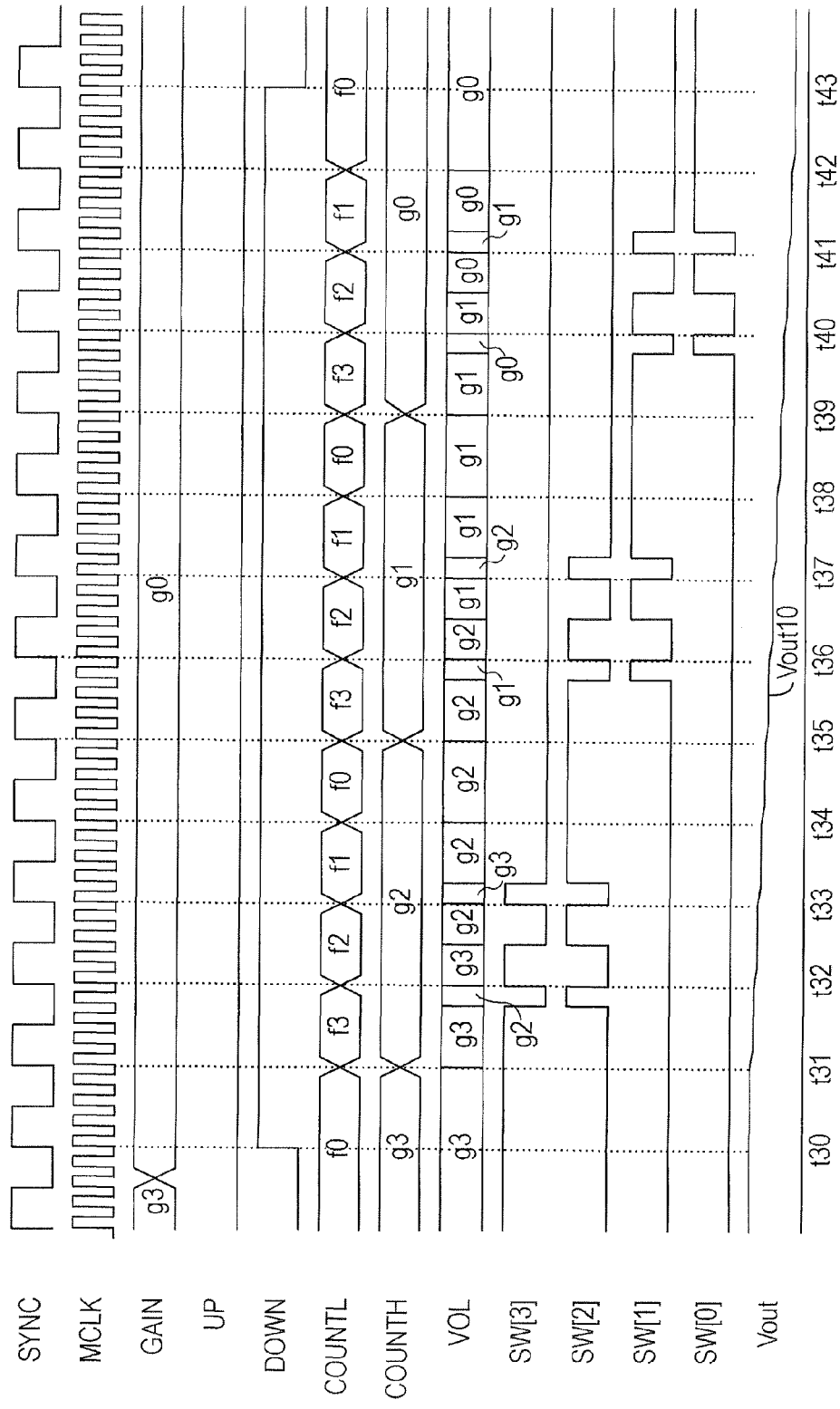
FIG. 7 illustrates exemplary operational waveforms of an electronic volume circuit.

FIG. 7 illustrates exemplary operational waveforms of an electronic volume circuit. The electronic volume circuit illustrated in FIG. 7 may be the volume circuit illustrated in FIG. 4. The operational waveforms illustrated in FIG. 7 may be operation waveforms obtained when the gain of the electronic volume circuit is reduced. In FIG. 7, the input gain GAIN is changed from the gain g3 to the gain g0. The operational waveforms illustrated in FIG. 7 may be inverted from those of the operational waveforms illustrated in FIGS. 5 and 6.

At time t30, the comparator 14 detects that the input gain GAIN changes from g3 to g0 and sets the down signal DOWN to a high level. Correspondingly, the up/down counter 20 counts down the count value COUNTH/COUNTL from g3/f0 to g2/f3 at time t31, to g2/f2 at time t32, to g2/f1 at t33, to g2/f0 at t34, to g1/f3 at t35, to g1/f2 at t36, to g1/f1 at t37, to g1/f0 at t38, to g0/f3 at t39, to g0/f2 at t40, to g0/f1 at t41, and to g0/f0 at t42. The time-division gain modulator circuit 22 modulates the count value COUNTH/COUNTL to generate the time-divided gain control signal VOL. A method for the modulation may be substantially the same as or similar to that illustrated in FIGS. 5 and 6.

As indicated by Vout10, the smoothed output signal Vout decreases, for example, in increments of one-fourth of the gain step between the gain g0 and the gain g1, illustrated in FIG. 3, in synchronization with the synchronization signal SYNC.

Figure 8:
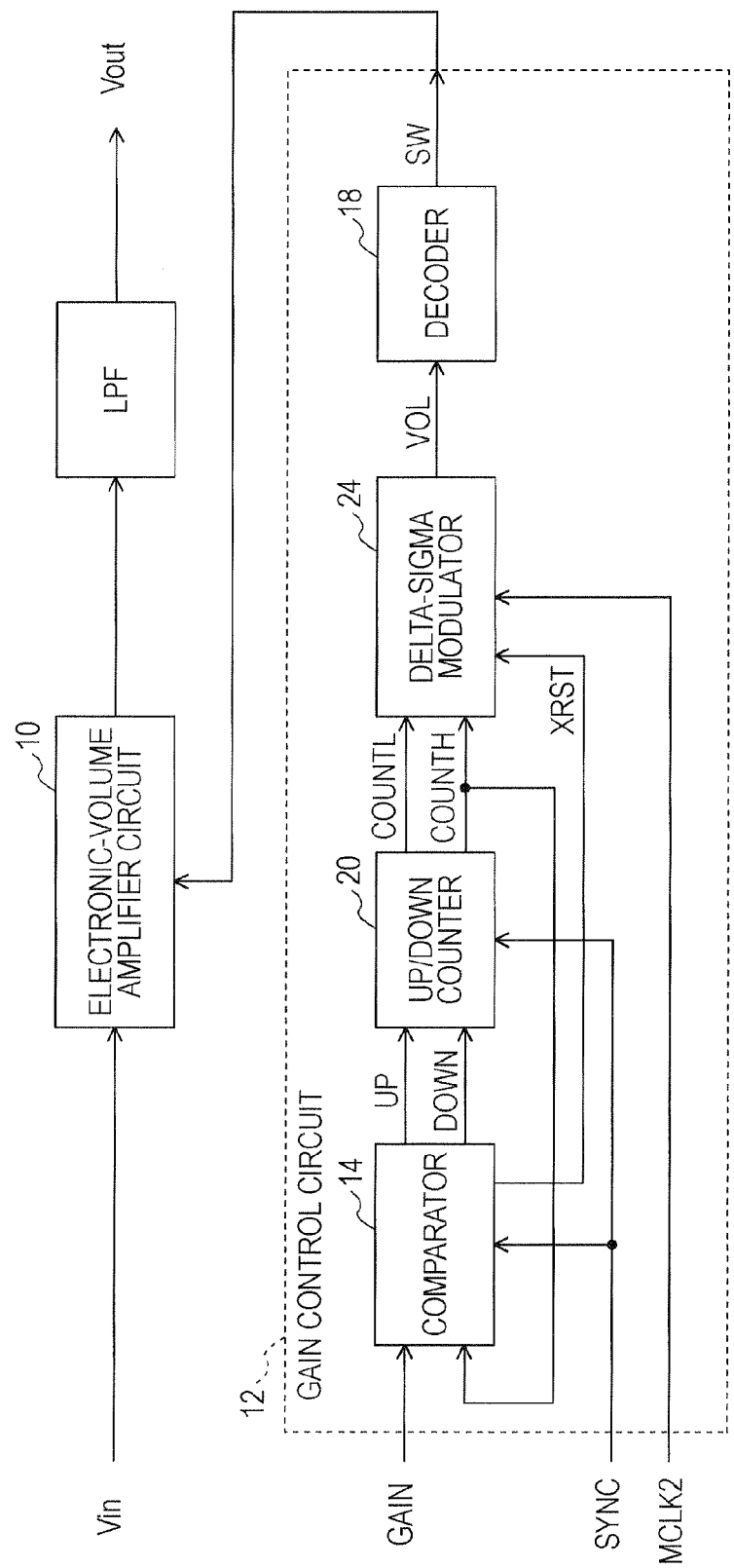
FIG. 8 illustrates an exemplary electronic volume circuit.

FIG. 8 illustrates an exemplary an electronic volume circuit. The electronic volume circuit illustrated in FIG. 8 includes a delta-sigma ($\Delta\Sigma$) modulator 24. The delta-sigma modulator 24 may correspond to the time-division gain modulator circuit 22 illustrated in FIG. 4. In response to a reset signal XRST generated by a comparator 14, the delta-sigma modulator 24 is activated or deactivated. The delta-sigma modulator 24 operates in synchronization with a master clock MCLK2. The master clock MCLK2 may have a higher speed than the master clock MCLK illustrated in FIG. 4. Since the master clock MCLK is divided to generate the synchronization signal SYNC, the master clock MCLK and the synchronization signal SYNC synchronize with each other.

The delta-sigma modulator 24 modulates the count values COUNTH and COUNTL of an up/down counter 20 to generate a gain control signal VOL. As in the time-division gain modulator circuit 22 illustrated in FIG. 4, the gain control signal VOL is controlled in a time-divided manner to have one of adjacent count values including the high-order count value COUNTH and a count value that is adjacent thereto, and the gain control signal VOL is generated so that the time-average of the gain control signals VOL matches the count values COUNTH and COUNTL. The delta-sigma modulator 24 reduces the amount of quantization noise in a low-frequency band.

Figure 9:
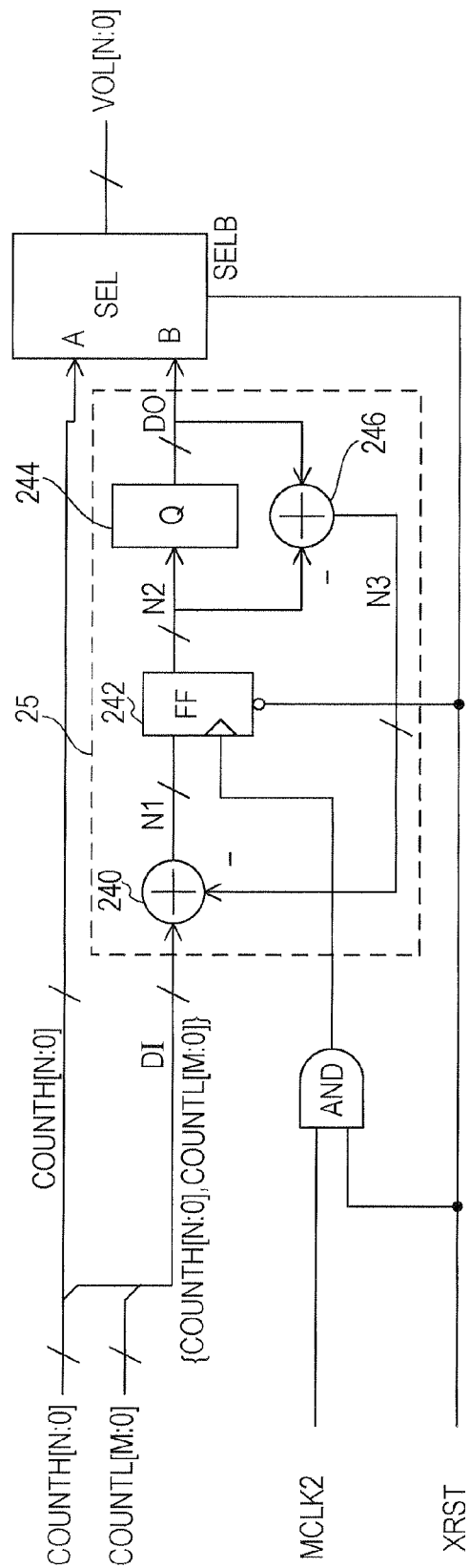
FIG. 9 illustrates an exemplary delta-sigma modulator.

FIG. 9 illustrates an exemplary delta-sigma modulator. A delta-sigma modulator 24 illustrated in FIG. 9 may be the delta-sigma modulator illustrated in FIG. 8. The delta-sigma modulator 24 includes a selector SEL, an AND gate AND, and a delta-sigma modulator circuit 25. High-order count values COUNTH[N:0] are input to an input A of the selector SEL and an output DO of the delta-sigma modulator 24 is input to an input B of the selector SEL. When the input gain GAIN and the high-order count value COUNTH match each other, the comparator 14 sets the reset signal XRST to a low level and the selector SEL outputs the high-order count value COUNTH as a gain control signal VOL[N:0]. When the reset signal XRST is at the low level, a delay circuit 242 in the delta-sigma modulator circuit 25 and the delta-sigma modulator circuit 25 stop. Thus, the operation enters a low-consumption current mode. In a steady state other than the gain sweep operation, the delta-sigma modulator 24 stops the modulation and outputs the high-order count value COUNTH as a gain control signal VOL.

The delta-sigma modulator circuit 25 includes a subtractor 240, the delay circuit 242, a quantizer 244, and a subtractor 246. The subtractor 240 subtracts an error N3 from the high-order count value COUNTH[N:0] and the low-order count value COUNTL[M:0]. The delay circuit 242 includes a flip-flop that delays an output N1 of the subtractor 240 by one cycle of the master clock MCLK2. The quantizer 244 generates the quantization output DO by quantizing an output N2 of the delay circuit 242 (i.e., the output N1 of the subtractor 240 earlier by one cycle). The subtractor 246 generates the error N3 by subtracting the output N2 of the delay circuit 242 from the quantization output DO. The quantizer 244 outputs, for example, the high-order count value COUNTH of the input N2 as the quantization output DO. The quantizer 244 may use another quantization method to generate the quantization output DO, for example, a method for rounding the low-order count value COUNTL.

In the delta-sigma modulator circuit 25, the subtractor 240 subtracts the quantization error N3 from an input DI. Thus, the quantization error N3 is accumulated at the output N2 of the subtractor 240, and adjacent high-order count values corresponding to the high-order count value COUNTH and a high-order count value that is adjacent thereto are generated as the outputs DO.

For example, for N2>DO, the quantizer 244 truncates the errors, so that the quantization error N3 becomes DO−N2, which is a negative value, and because of the output N1=DI−N3 of the subtractor 240, the absolute value of the quantization error N3 is added to the input DI. Thus, the quantizer 244 sequentially truncates the errors, the quantization errors are integrated, and the quantizer 244 generates a quantization output DO that is higher by one step.

Conversely, for N2<DO, the quantizer 244 rounds up the errors, so that the quantization error N3 becomes DO−N2, which is a positive value, and because of the output N1=DI−N3 of the subtractor 240, the absolute value of the quantization error N3 is subtracted from the input DI. Thus, the quantizer 244 sequentially truncates the errors, the quantization errors are integrated, and the quantizer 244 generates a quantization output DO that is lower by one step.

Figure 10:
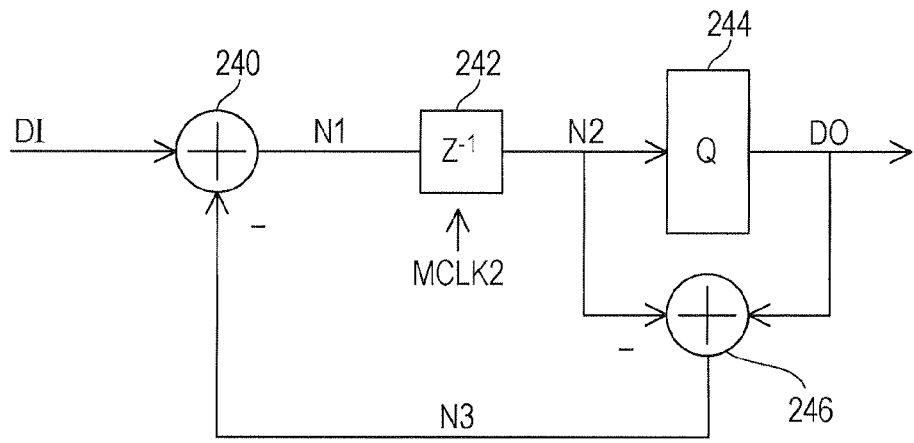
FIG. 10 illustrates an exemplary operation of a delta-sigma modulator.

FIG. 10 illustrates an exemplary operation of a delta-sigma modulator circuit. A delta-sigma modulator circuit 25 illustrated in FIG. 10 may be the delta-sigma modulator circuit illustrated in FIG. 8. The quantizer 244 performs truncation on a low-order count value of the input N2 and outputs a high-order count value as the quantization output DO. For example, the input DI may be 1.25, the high-order count value COUNTH may be 1.00, and the low-order count value COUNTL may be 0.25.

At time "0", the input DI=1.25 is input, the error N3=0, which is an initial value, is subtracted, so that the output N1=1.25 of the subtractor 240 is generated. The output N1 is latched by the delay circuit 242. At time "1", the input DI=1.25 is input, the delay circuit 242 outputs an output N2=1.25, and the quantizer 244 performs truncation on the output N2 and outputs a quantization output DO=1. The error N3=−0.25 is generated, N3 is subtracted from the input DI=1.25, so that the output N1=1.50 of the subtractor 240 is generated. At times "2" and "3", similar quantization may be performed, so that quantization outputs DO=1 and 1 are generated. At time "4", the delay circuit 242 outputs an output N2=2.00, and the quantizer 244 performs truncation on the output N2 and outputs a quantization output DO=2. The error N3=0 is generated and N3 is subtracted from the input DI=1.25, so that an output N1=1.25 is output from the subtractor 240. Operations at times "5" to "8" may be substantially the same as those at times "1" to "4". The quantization outputs DO=1, 1, 1, 2 are repeated in every four cycles of the master clock MCLK2.

Figure 11:
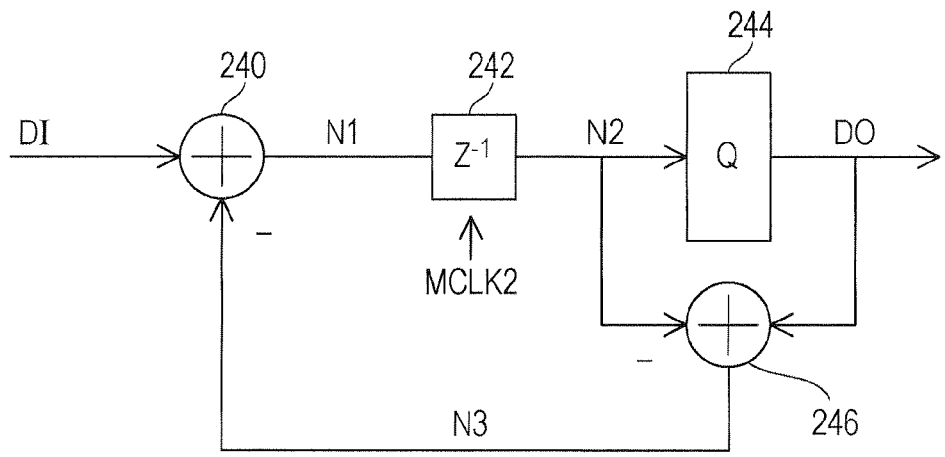
FIG. 11 illustrates an exemplary operation of a delta-sigma modulator.

FIG. 11 illustrates an exemplary operation of a delta-sigma modulator circuit. A delta-sigma modulator circuit 25 illustrated in FIG. 11 may be the delta-sigma modulator circuit 25 illustrated in FIG. 9. A quantizer 244 generates a quantization output DO by rounding the low-order count value of the input N2. The quantization error N3 may be a positive or negative. The error N3 accumulated at the input DI of the subtractor 240 and quantization outputs DO=1, 2, 1, 1 are repeated. In FIG. 11, the quantization is performed through rounding.

The delta-sigma modulator 24 illustrated in FIGS. 10 and 11 modulates the quantization output VOL into a value corresponding to one of the adjacent gains, in synchronization with the master clock MCLK2. In FIG. 11, the high-order count value and the low-order count value are illustrated as 1.00 and 0.25, respectively, for simplification of description. The high-order count value and the low-order count value have, for example, large level resolutions, such as eight bits, and thus may be different from the count values illustrated in FIGS. 10 and 11.

Figures 12A, 12C, 12D:
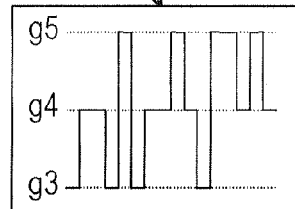

FIG. 12 illustrates exemplary operations of a delta-sigma modulator. A delta-sigma modulator 24 illustrated in FIG. 12 may be the delta-sigma modulator illustrated in FIG. 8. FIG. 12A illustrates an input GAIN corresponding to the high-order count value COUNTH. The gain GAIN has eight steps from a minimum value GAINmin to a maximum value GAINmax. FIG. 12B illustrates the levels of the high-order count value COUNTH and the low-order count value COUNTL of the counter. The gains g0 to g7 of the high-order count value COUNTH correspond to the input gains GAIN. With f0 to f3 of the low-order count value COUNTL, the width of one step of the inputs COUNTH and COUNTL of the delta-sigma modulator 24 is smaller than that of the input gain GAIN.

FIG. 12C illustrates the output VOL of the delta-sigma modulator 24. A portion having a high density represents that the probability of occurrence is high. As illustrated in FIG. 12D, which is an enlarged diagram, the output VOL of the delta-sigma modulator 24 is set to one of adjacent high-order count values g3, g4, and g5, and the probability of occurrence of each of the high-order count values is indicated by the density. The time average increases linearly from the minimum gain g0 to the maximum gain g7. Thus, when the input gain GAIN is changed, smooth gain sweep operation is performed.

Example embodiments of the present invention have now been described in accordance with the above advantages. It will be appreciated that these examples are merely illustrative of the invention. Many variations and modifications will be apparent to those skilled in the art.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A gain control circuit comprising:
   a comparator configured to compare an input gain value with a count value to generate a comparison result signal;
   a counter configured to increase or decrease the count value in accordance with the comparison result signal; and
   a gain modulator circuit configured to modulate the count value to generate a gain control signal which changes in a time-divided manner,
   wherein the gain modulator circuit is configured to modulate the count value so that a gain obtained by time-averaging a gain corresponding to the gain control signal matches a gain based on the count value.

2. The gain control circuit according to claim 1, wherein the count value includes a high-order count value and a low-order count value, and
   wherein the gain modulator circuit is configured to change, in a time-divided manner, the gain control signal to one of a first gain control signal corresponding to a first gain corresponding to the high-order count value and a second gain control signal corresponding to a second gain corresponding to an adjacent high-order count value that is adjacent to the high-order count value.

3. The gain control circuit according to claim 2, wherein the gain modulator circuit is further configured to change the gain control signal from the first gain control signal to the second gain control signal in a plurality of cycles when the input gain changes from the first input gain to the second input gain, and
   wherein the gain modulator circuit is configured to output, in a time-divided manner, the first gain control signal and the second gain control signal in the plurality of cycles.

4. The gain control circuit according to claim 3, wherein the gain modulator circuit is configured to modulate time widths of the first gain control signal and the second gain control signal so that a gain obtained by time-averaging gains corresponding to the first gain and the second gain is substantially equal to a gain corresponding to the high-order count value or the low-order count value.

5. The gain control circuit according to claim 4, wherein the gain modulator circuit is configured to output one of the gain control signals corresponding to the first gain and the second gain in a time-division cycle that is shorter than a cycle in the plurality of cycles, and
wherein an average value of the gains corresponding to the first gain and the second gain in the cycle is controlled to be substantially equal to the gain corresponding to the high-order count value or the low-order count value.

6. The gain control circuit according to claim 3, wherein the gain modulator circuit includes a delta-sigma modulator circuit that is configured to integrate errors between the high-order count value or the low-order count value and the high-order count value.

7. The gain control circuit according to claim 6, wherein the delta-sigma modulator circuit includes:
a subtractor that is configured to subtract an error from the high-order count value or the low-order count value and to output a high-accuracy count value;
a delay circuit that is configured to delay the high-accuracy count value;
a quantizer that is configured to output a high-order count value included in the high-accuracy count value; and
an error generator circuit that is configured to generate an error between the high-accuracy count value and the high-order count value.

8. An electronic volume circuit comprising:
an amplifier circuit that is configured to adjust a gain of an input signal based on a gain control signal; and
a gain control circuit that is configured to supply the gain control signal to the amplifier circuit,
wherein the gain control circuit includes:
a comparator that is configured to compare an input gain value with a count value to generate a comparison result signal,
a counter that is configured to count in accordance with the comparison result signal, and
a gain modulator circuit that is configured to modulate the count value to generate a gain control signal that changes in a time-divided manner,
wherein the gain modulator circuit is configured to modulate the count value so that a gain obtained by time-averaging a gain corresponding to the gain control signal matches a gain based on the count value.

9. The electronic volume circuit according to claim 8, wherein the count value includes a high-order count value and a low-order count value, and
wherein the gain modulator circuit is configured to change, in a time-divided manner, the gain control signal to one of a first gain control signal corresponding to a first gain corresponding to the high-order count value and a second gain control signal corresponding to a second gain corresponding to an adjacent high-order count value that is adjacent to the high-order count value.

10. The electronic volume circuit according to claim 9, wherein the gain modulator circuit is configured to change the gain control signal from the first gain control signal to the second gain control signal in a plurality of cycles when the input gain changes from the first input gain to the second input gain, and
wherein the gain modulator circuit is configured to output, in a time-divided manner, the first gain control signal and the second gain control signal in the plurality of cycles.

11. The electronic volume circuit according to claim 10, wherein the gain modulator circuit is configured to modulate time widths of the first gain control signal and the second gain control signal so that a gain obtained by time-averaging gains corresponding to the first gain and the second gain is substantially equal to a gain corresponding to the high-order count value or the low-order count value.

* * * * *